United States Patent [19]

Tanaka et al.

[11] Patent Number: 4,988,608
[45] Date of Patent: Jan. 29, 1991

[54] METHOD FOR FORMING FINE PATTERN OF CONJUGATED POLYMER FILM

[75] Inventors: Toshihiko Tanaka; Shuji Doi, both of Tsukuba, Japan

[73] Assignee: Sumitomo Chemical Company, Limited, Osaka, Japan

[21] Appl. No.: 431,178

[22] Filed: Nov. 3, 1989

[30] Foreign Application Priority Data

Nov. 7, 1988 [JP] Japan ............................. 63-281785

[51] Int. Cl.$^5$ ..................... G03C 5/16; G03F 7/038; G03F 7/32
[52] U.S. Cl. .................... 430/325; 430/270; 430/330; 430/322; 430/315; 430/324; 430/914
[58] Field of Search ............... 430/325, 270, 330, 322, 430/315, 324, 914

[56] References Cited

U.S. PATENT DOCUMENTS

4,816,383 3/1989 Taguchi et al. ............... 430/322

FOREIGN PATENT DOCUMENTS

3704411 8/1987 Fed. Rep. of Germany.

*Primary Examiner*—Cynthia Hamilton
*Attorney, Agent, or Firm*—Stevens, Davis, Miller & Mosher

[57] ABSTRACT

Disclosed is a method for forming a fine pattern of a conjugated polymer according to which the fine pattern can be formed even by using a high pressure mercury lamp as a light source for irradiation. This method comprises irradiating a coat containing a precursor for conjugated polymers which has a recurring unit represented by the formula (1):

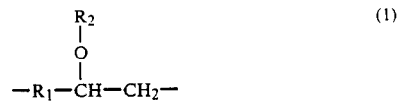

(1)

wherein $R_1$ represents

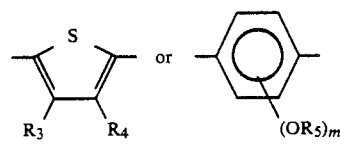

ps in which $R_3$ and $R_4$ each represents a hydrogen atom or an alkyl or alkoxy group of 1-5 carbon atoms, $R_5$ represents a hydrocarbon group of 1-5 carbon atoms and m is 1 or 2; and $R_2$ represents a hydrogen atom or a hydrocarbon group of 1-10 carbon atoms with a light of 200-500 nm in wavelength in pattern form and then dissolving and removing the polymer of unirradiated portion. It is preferred to heat treat the resulting fine pattern. Furthermore, the resulting pattern can have electrical conductivity by doping it with an electron donating or accepting dopant.

8 Claims, No Drawings

METHOD FOR FORMING FINE PATTERN OF CONJUGATED POLYMER FILM

BACKGROUND OF THE INVENTION

The present invention relates to a method for forming fine pattern of a conjugated polymer film.

Conjugated polymers represented by polyacetylene are expected to be applied to devices such as memory devices, sensors, solar batteries, storage batteries, optical devices, and nonlinear optical devices. Considering application to such photoelectronic devices, to form conjugated polymers into a desired pattern is a technique which is very advantageous for formation of circuits using them. It is known, for example, in U.S. Pat. No. 4,816,383 to form a negative pattern by coating on a substrate a solution containing a polymeric sulfonium salt which is a precursor for poly-p-phenylenevinylene, then irradiating the coat with ultraviolet rays in pattern form and then removing the film of unexposed portion with a solvent. This pattern of precursor can be converted to a conjugated polymer poly-p-phenylenevinylene by heat treatment.

When conjugated polymers are used for memory devices, optical devices and nonlinear optical devices, generally a fine circuit pattern is formed on a flat substrate by photolithography. Photolithography is commonly carried out by mask aligner and stepper which have as light sources bright lines such as i-line (365 nm), h-line (404.7 nm) and g-line (435.8 nm) of high pressure mercury lamp and cost for apparatus is low and performance thereof is stable. In order to obtain finer pattern, irradiation with light of short wavelength is conducted. However, irradiation with ultraviolet rays of short wavelength from light sources such as xenon lamp, xenon mercury lamp, and excimer laser sometimes causes side reactions undesirable for resist materials such as decomposition and crosslinking. Such crosslinking or decomposition damages characteristics of conjugated polymers, for example, cleavage of conjugaged system. Therefore, development of lithographic technique with wavelength which causes no side reactions has been demanded for forming pattern of conjugated polymers. Furthermore, if the popular irradiation device which uses high pressure mercury lamp can be utilized, this is industrially advantageous.

According to the research conducted by the inventors, in case of poly-p-phenylenevinylene, when a polymeric sulfonium salt which is a precursor is irradiated by high pressure mercury lamp, this was insufficiently cured and swollen in a developing solution, so that sufficiently fine pattern was not able to be formed. Furthermore, depending on kind of polymeric sulfonium salt which is a precursor and kind of solvent for development, positive patterns may be formed with irradiation by high pressure mercury lamp, but these positive patterns are inferior in resolution and sufficiently fine patterns cannot be formed.

SUMMARY OF THE INVENTION

The object of the present invention is to provide a method for formation of pattern according to which fine pattern can be formed by irradiation with light of long wavelength of 500 nm or less which causes no side reaction and besides, fine pattern of a conjugated polymer can be formed by the generally employed irradiation device which uses high pressure mercury lamp as a light source.

As a result of intensive research conducted by the inventors on a method for forming pattern of conjugated polymers, it has been found that when a soluble intermediate having an alkoxy group on side chain is formed into a thin film and this thin film is irradiated with light of a wavelength of 500 nm or less, the side chain is eliminated to result in a thin film of conjugated polymer. It has also been found that when the thin film is irradiated with light in the form of pattern, fine pattern is formed.

DETAILED DESCRIPTION OF THE INVENTION

The present invention will be explained in detail.
The present invention uses a polymer precursor having a recurring unit represented by the formula (1):

$$-R_1-\overset{\overset{R_2}{|}}{\underset{|}{C}}H-CH_2- \qquad (1)$$

$$\phantom{xxxxxxxxxxx}O$$

wherein
$R_1$ represents

$R_2$ represents a hydrogen atom or a hydrocarbon group of 1–10 carbon atoms;
$R_3$ and $R_4$ each represents a hydrogen atom, a hydrocarbon group of 1–5 carbon atoms, or an alkoxy group of 1–5 carbon atoms;
$R_5$ represents a hydrocarbon group of 1–5 carbon atoms; and m represents 1 or 2.

With reference to polymerization degree of the polymer precursors having the recurring unit of the formula (1), those which have at least 5, preferably 10 to 50000 units are used.

Upon irradiation with light or heating, the polymer precursor releases the alkoxy group of side chain to become a polymer having a conjugated structure represented by the formula (2):

$$-R_1-CH=CH- \qquad (2)$$

wherein
$R_1$ represents

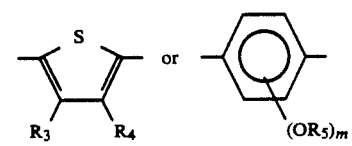

$R_3$ and $R_4$ each represent by atom, a hydrocarbon group of 1–5 carbon atoms or an alkoxy group of 1–5 carbon atoms;
$R_5$ represents a hydrocarbon group of 1–5 carbon atoms; and m represents 1 or 2.

In the above formulas (1) and (2), $R_1$ is

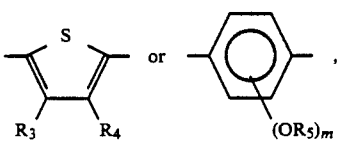

but in order to make easy the irradiation with high pressure mercury lamp, $R_1$ is preferably a thienyl group or a substituted thienyl group represented by the formula:

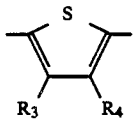

$R_3$ and $R_4$ each represents a hydrogen atom or an alkyl group or alkoxy group of 1-5 carbon atoms, but if carbon number of these alkyl and alkoxy groups is too many, the irradiated portion is apt to be dissolved in developing solution and formation of pattern becomes difficult. For this reason, if one of $R_3$ and $R_4$ is hydrogen, another of $R_3$ and $R_4$ is preferably an alkyl group or alkoxy group of 1-3 carbon atoms and especially preferably hydrogen. When both the $R_3$ and $R_4$ are alkyl group or alkoxy group, they are preferably alkyl group or alkoxy group of 1-2 carbon atoms.

When $R_1$ in the formula (1) is an alkoxy-substituted phenylene group represented by the formula:

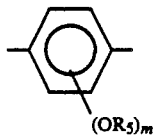

an alkyl group of 1-5 carbon atoms is used as $R_5$ and carbon number of 1-3 is preferred and that of 1 is especially preferred from the point of quality of pattern produced. Further, m in the above formula is 1 or 2, but m is preferably 2, considering application to photoelectric uses, for example, when the produced conjugated polymer is subjected to doping to give electrical conductivity. Furthermore, it is especially preferred that the two alkoxy groups are at the positions which are symmetrical about a point (namely, 2,5-dialkoxy-substituted phenylene).

$R_2$ in the formula (1) is a hydrogen atom or a hydrocarbon group of 1-10 carbon atoms such as, for example, methyl, ethyl, propyl, isopropyl, n-butyl, 2-ethylhexyl, phenyl and cyclohexyl. Preferred are hydrocarbon groups of 1-6 carbon atoms and especially preferred are methyl and ethyl.

The polymer precursor in the present invention may be of single composition or a mixture of two or more. Furthermore, this polymer precursor may be used in the form of copolymer of two or more of the precursors included in the scope of the present invention.

Process for preparation of the polymer precursor is not critical, but preparation thereof through a polymeric sulfonium salt is preferred. For example, the polymer precursor can be prepared by the process disclosed, for example, in "Polymer Communications", vol. 28 (1987), pp. 229-231. That is, it is preferred to react a polymeric sulfonium salt having a recurring unit represented by the formula:

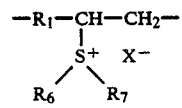

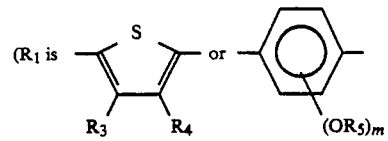

$R_3$ and $R_4$ each a hydrogen atom, a hydrocarbon group of 1-5 carbon atoms or an alkoxy group of 1-5 carbon atoms, $R_5$ a hydrocarbon group of 1-5 carbon atoms, m: 1 or 2, $R_6$ and $R_7$ each a hydrocarbon group of 1-10 carbon atoms, $X^-$: a counter ion with an alcohol $R_2OH$ ($R_2$ corresponds to the alkoxy side chain shown in the formula (1)).

Next, method for use of the polymer precursor in the present invention will be explained. This polymer precursor is normally used in the form of solution and solvents which dissolve the polymer precursor of the formula (1) are used. These solvents vary depending on kind of R and $R_2$ of the polymer precursor and are properly selected. For example, when $R_1$ is a hydrogen atom and $R_2$ is a methyl group or an ethyl group, organic solvents such as dimethylsulfoxide, dimethylformamide, dimethylacetamide, dioxane, tetrahydrofuran and chloroform are used and chloroform and tetrahydrofuran are preferred and chloroform is especially preferred from the point of uniformity of coated film. These solvents may also be used as a mixture of two or more.

Coating method of the polymer precursor has no special limitation and there may be employed those methods which are usually employed for coating of resist materials, for example, spin coating method.

Light of 500 nm or less in wavelength is effective to be used in the present invention and ultraviolet rays of 450 nm or less are preferred from the point of efficiency or quality of pattern and ultraviolet rays of 400 nm or less are especially preferred. Since lights of less than 250 nm, especially less than 200 nm cause defects in conjugated polymer produced, it is preferred not to include these lights. Considering defects of conjugated polymer produced and quality of pattern, xenon-mercury lamp, xenon lamp, excimer laser and so on can be used, but high pressure mercury lamp is especially preferred, considering cost for irradiation apparatus and reliability and because no undesirable side reactions take place.

For development, solvents which dissolve the polymer precursor of the formula (1) are used. That is, it is suitable to use the same solvents as used in coating. With reference to developing time and temperature, the development may be generally carried out in the temperature range within which the developing solution maintains liquid state until the developing solution has completely dissolved and removed unirradiated portion, although there are some differences depending on kind of the precursor and film thickness.

Next, method for converting the developed pattern of the precursor to conjugated polymer will be explained. The pattern obtained by development is partially in conjugated form and so can be used as it is. However, since it also contains structure of precursor, it is preferred to convert the structure of precursor to conjugated polymer from the viewpoint to develop characteristics of conjugated polymer. For conversion, there may be used treatments with heat, acid, light, corpuscular beam, etc. and heat treatment is preferred, considering efficiency of conversion. In this case, heat treating temperature is preferably 100-400° C., more preferably 200-300° C. The heat treatment is carried out preferably in an inert atmosphere such as an inert gas, e.g., nitrogen, argon or helium or in vacuum. The heat treatment can be accerelated by containing in the heat treating atmosphere 0.001-20 vol % of a protonic acid, for example, vapor of HCl or HBr.

Pattern of conjugated polymer formed by the above-mentioned method can be made electrically conductive by doping with electron donating or electron accepting dopant. For doping, there may be suitably used methods used for doping of conjugated polymers such as polyacetylene, for example, vapor phase doping, liquid phase doping, electrolytic doping and ion implantation.

As explained above, since according to the present invention fine pattern of conjugated polymer can be produced by high pressure mercury lamp which is most commonly used light source, patterns such as waveguide required for optical IC can be easily produced. The resulting pattern of conjugated polymer can develop electrical conductivity by doping and thus is markedly useful for application to organic functional devices such as memory, sensor, solar battery, storage battery, optical device, and nonlinear optical device.

The following nonlimiting examples explain the present invention in more detail.

EXAMPLE 1

By the method and under the conditions as mentioned in "Polymer Communications", vol. 28 (1987), pp. 229-231, 2,5-thienylenebis(methylenedimethylsulfonium bromide) was subjected to polycondensation with alkali and the product was reacted with methyl alcohol to prepare a precursor of poly-2,5 thienylenevinylene which had the following structure:

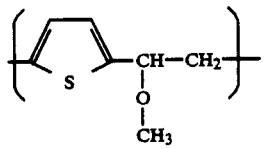

A chloroform solution (2%) of this precursor was spin coated on a silicon wafer having oxide film (film thickness: 1000 nm) at a thickness of about 150 nm at a number of revolution of 2000 rpm for 20 seconds. This wafer was irradiated in pattern form with ultraviolet rays by a mask aligner with a high pressure mercury lamp of 500W as a light source and then was subjected to development with chloroform, whereby the precursor thin film of unirradiated portion was dissolved out to form a pattern. This pattern was heat treated at 250° C. for 20 minutes in nitrogen stream to obtain a pattern of polythienylenevinylene. This pattern had a line width of about 2 microns in miniumum. When this pattern was subjected to doping by exposing to iodine atmosphere, it showed an electrical conductivity of about 0.1 S/cm.

EXAMPLE 2

A precursor of poly-2,5 thienylenevinylene of the formula (1) wherein $R_1$ is a thineylene group of $R_3$ and $R_4$ being hydrogen and $R_2$ is ethyl group was prepared in the same manner as in Example 1 except that water-/ethanol was used in place of water/methanol as solvent for polycondensation of the sulfonium salt monomer and for dialysis. In the same manner as in Example 1, chloroform solution of this precursor was coated, irradiated with ultraviolet rays and developed to form a pattern. As in Example 1, a pattern having a minimum line width of 2 microns was formed and its electrical conductivity was increased to 0.1 S/cm by doping with iodine.

EXAMPLE 3

According to the method mentioned in "Polymer Preprint", Vol. 37, No. 3 (1988), page 680, 2,5-dimethoxy-p-xylylenebis(dimethylsulfonium bromide) was subjected to polycondensation with alkali and the product was reacted with methanol to obtain a precursor of (2,5-dimethoxy-p-phenylenevinylene) having a methoxy group in side chain. A chloroform solution (2%) of this precursor was spin coated on a silicon wafer having oxide film (film thickness: 1000 nm) at a thickness of about 150 nm at a number of revolution of 2000 rpm for 20 seconds. This wafer was irradiated in pattern form with ultraviolet rays by a mask aligner with a high pressure mercury lamp of 500W as a light source and then subjected to development with chloroform, whereby the precursor thin film of unirradiated portion was dissolved out to form a pattern. This pattern was heat treated at 250° C. for 20 minutes in a nitrogen stream to obtain a pattern of poly(2,5-dimethoxyphenylenevinylene). This pattern had a minimum line width of about 2 microns.

COMPARATIVE EXAMPLE 1

Example 1 was repeated except that irradiation was carried out with light of high pressure mercury lamp using a filter which cut off a light of 500 nm or less in wavelength. no pattern was formed.

What is claimed is:

1. A method for formation of fine pattern of a conjugated polymer film which comprises irradiating a coat containing a precursor for conjugated polymers which has a recurring unit represented by the formula (1):

wherein $R_1$ represents

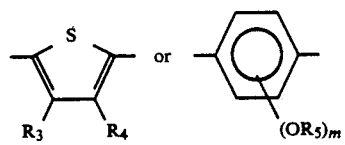

in which $R_3$ and $R_4$ each represents a hydrogen atom or an alkyl or alkoxy group of 1-5 carbon atoms, $R_5$ represents a hydrocarbon group of 1-5 carbon atoms and m is 1 or 2; and $R_2$ represents a hydrogen atom or a hydrocarbon group of 1–10 carbon atoms with a light of 200–500 nm in wavelength in pattern form and then dissolving and removing the precursor of unirradiated portion.

2. A method according to claim 1, wherein the precursor has the formula (1) in which $R_1$ is a thienylene group and $R_2$ is a methyl group.

3. A method according to claim 1, wherein the precursor has the formula (1) in which $R_1$ is a 2,5-dimethoxyphenylene group and $R_2$ is a methyl group.

4. A method according to claim 1, wherein the light irradiated has a wavelength of 250–450 nm.

5. A method according to claim 4, wherein the light irradiated has a wavelength of 250–400 nm.

6. A method according to claim 1, 2 or 3, wherein source of the light irradiated is a high pressure mercury lamp.

7. A method according to claim 1, 2 or 3, wherein fine pattern obtained by dissolving and removing the unirradiated portion is heat treated at 100–400° C.

8. A method according to claim 1, 2 or 3, wherein the fine pattern of conjugated polymer film is subjected to doping.

* * * * *